United States Patent [19]

Tahernia et al.

[11] Patent Number: 4,896,122
[45] Date of Patent: Jan. 23, 1990

[54] MULTIPLE BANDWIDTH CRYSTAL CONTROLLED OSCILLATOR

[75] Inventors: Omid Tahernia, Coconut Creek; Barry W. Herold, Boca Raton, both of Fla.; Kenneth R. Burch, Austin, Tex.

[73] Assignee: Motorola, Inc., Schaumburg, Ill.

[21] Appl. No.: 380,047

[22] Filed: Jul. 14, 1989

[51] Int. Cl.4 .............................................. H03B 5/32
[52] U.S. Cl. .............................. 331/158; 331/116 FE
[58] Field of Search .................. 331/158, 160, 116 R, 331/116 FE; 368/159

[56] References Cited

U.S. PATENT DOCUMENTS

| | | | |
|---|---|---|---|
| 3,676,801 | 7/1972 | Musa | 331/116 R |
| 4,282,496 | 8/1981 | Heuner | 331/116 FE |
| 4,321,562 | 3/1982 | Igarashi | 331/116 FE |
| 4,370,625 | 1/1983 | Someshwar | 331/49 |
| 4,387,350 | 6/1983 | Bessolo et al. | 331/116 FE |

Primary Examiner—Eugene R. LaRoche
Assistant Examiner—Robert J. Pascal
Attorney, Agent, or Firm—Philip P. Macnak; Vincent B. Ingrassia

[57] ABSTRACT

A dual bandwidth crystal controlled oscillator is described having a first transconductance amplifier providing sufficient gain to maintain oscillation with an oscillator crystal at a minimum current drain. A second transconductance amplifier is provided which can be selectively coupled to the first transconductance amplifier, thereby augmenting the gain of the first transconductance amplifier to provide the capability for rapid oscillator start-up following battery saver operation. The dual bandwidth crystal controlled oscillator can be utilized in conventional oscillator and frequency synthesizer applications.

11 Claims, 5 Drawing Sheets

MULTIPLE BANDWIDTH CRYSTAL CONTROLLED OSCILLATOR

BACKGROUND OF THE INVENTION

1. Field of the Invention

This invention relates generally to the field of crystal controlled oscillator circuits, and more particularly to a multiple bandwidth crystal controlled oscillator circuit providing rapid oscillator start-up and low operating current drain.

2. Description of the Prior Art

Crystal controlled oscillators are widely used in communication receivers to establish the operating frequency or channel on which the communication receiver is to operate. Crystal controlled oscillators have in the past been designed to provide rapid start-up times, such as required in a communication receiver having battery saver features. Such crystal controlled oscillators were generally operated at relatively high current drains, which were required to insure rapid oscillator start-up times so that the communication receiver would be capable of receiving transmitted information in relatively short periods of time. As a result, the current drain of the oscillator circuit was typically a significant portion of the communication receiver current drain, in some instances being as much as one-third of the receiver-on current drain. The ultimate battery life provided in the prior art communication receiver was primarily determined by the receiver-on current drain, and as indicated this was highly influenced by the requirement of high operating currents to insure crystal oscillator start-up in a minimum amount of time.

Synthesized communication receivers also utilized crystal controlled oscillators to provide the reference frequency for the frequency synthesizer. The time required for the receiver to receive transmitted information was determined both by the time required to effect reference oscillator start-up and the time required to stabilize the frequency synthesizer output. In order to achieve rapid frequency synthesizer start-up times, the reference oscillator start-up time had to be minimized, generally at the expense of increased current drain of the crystal oscillator. The ultimate battery life provided in a synthesized communication receiver was consequently determined not only by the receiver current drain, as in a non-synthesized communication receiver, but also by the synthesizer current drain and the increased current drain added for reference oscillator start-up.

A typical prior art crystal controlled oscillator 100 is shown in FIG. 1. When implemented using CMOS integrated circuit technology, the circuit forms a CMOS Pierce oscillator which is described in U.S. Pat. No. 3,676,801 to Musa which is assigned to the assignee of the present invention. While such an oscillator is suitable as a reference oscillator for microprocessors and microcomputers, the problem of slow start-up times, unless operated at high current levels, limits the use as a reference oscillator in a synthesized communication receiver employing battery saving techniques, unless high current drains are utilized to provide the necessary rapid oscillator start-up times.

SUMMARY OF THE INVENTION

It is an object of the present invention to provide a crystal controlled oscillator providing rapid start-up times.

It is a further object of the present invention to provide a crystal controlled oscillator which minimizes the energy required to start the oscillator.

It is a further object of the present invention to provide a crystal controlled oscillator which operates at a significantly lower current drain to maintain crystal oscillator operation.

A dual bandwidth crystal controlled oscillator is described having a first transconductance amplifier providing sufficient gain to maintain oscillation with an oscillator crystal at a minimum current drain. A second transconductance amplifier is provided which can be selectively coupled to the first transconductance amplifier, thereby augmenting the gain of the first transconductance amplifier, to provide the capability for rapid oscillator start-up following battery saver operation.

BRIEF DESCRIPTION OF THE DRAWINGS

The features of the invention which are believed to be novel are set forth with particularity in the appended claims. The invention itself, together with its further objects and advantages thereof, may be best understood by reference to the following description when taken in conjunction with the accompanying drawings, in the several figures of which like reference numerals identify identical elements, in which, and wherein:

DESCRIPTION OF THE PREFERRED EMBODIMENTS

Figure 2:
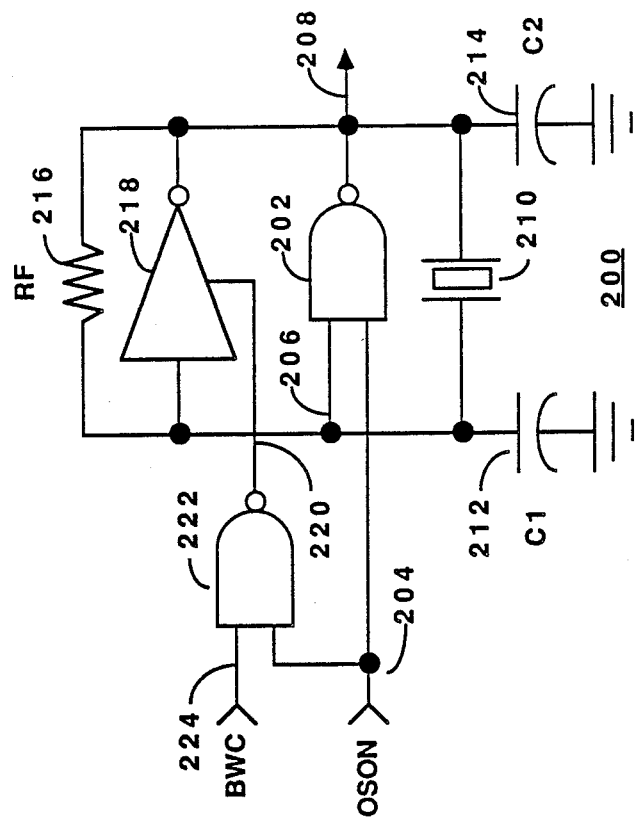
FIG. 2 is an electrical schematic diagram of the dual bandwidth crystal controlled oscillator of the present invention.
Figure 1:
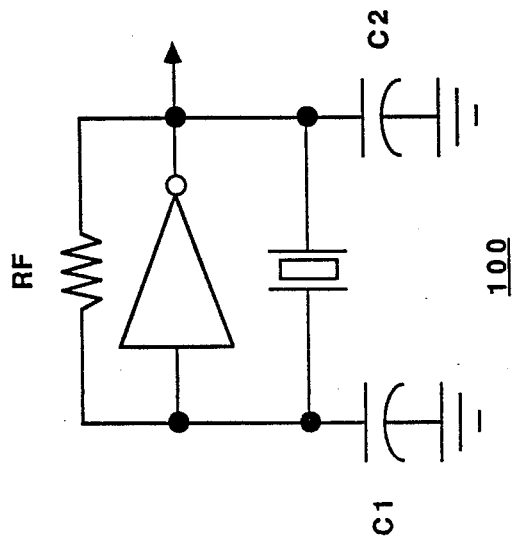
FIG. 1 is an electrical schematic diagram of a prior art crystal controlled oscillator.

FIGS. 2 through 7 show the preferred embodiment of the present invention, a multiple bandwidth crystal controlled oscillator which is suitable for use in reference oscillator circuits which require rapid start-up times and controlled operating currents. In particular, FIG. 2 shows an electrical schematic diagram of one embodiment of the invention, a dual bandwidth crystal controlled oscillator 200. The dual bandwidth crystal oscillator 200 includes a CMOS NAND gate 202, which, when enabled via input 204, functions as a conventional CMOS inverter having an input 206 and an output 208 coupled to an oscillator crystal 210 as in a standard CMOS Pierce oscillator configuration. Capacitors $C_1$ (212) and $C_2$ (214) are load capacitors providing the required phase shift in conjunction with oscillator crystal 210 to initiate and sustain oscillation as is well known in the art. The CMOS inverter functions as a high gain transconductance amplifier when bias is provided by the addition of resistor $R_F$ (216), which is also well known in the art. The operating current of CMOS inverter 202 is a function of the geometry of the MOS transistors forming NAND gate 202, as will be described in further detail shortly. CMOS NAND gate 202, hereinafter referred to as CMOS inverter 202, when properly enabled, is designed to provide only sufficient gain at a minimum operating current drain as required to maintain stable oscillation over a wide range of temperatures and environmental conditions. Because of the relatively low operating current, the transconductance amplifier gain formed by CMOS inverter 202, and also referred hereafter as first transconductance amplifier 202, is low, which implies a narrow open loop bandwidth, resulting in relatively slow oscillator start-up times. The CMOS Pierce oscillator formed by inverter 202 and oscillator crystal 210, is well suited for use as reference oscillators for communication devices which do not provide a battery saving function, and consequently require operation of the reference oscillator at a minimum current drain.

A second CMOS inverter 218, having a controllable 3-state output characteristic which will be described shortly, is placed in parallel with CMOS inverter 202, i.e. the input and output of CMOS inverter 218 is coupled to the input and output of CMOS inverter 202, respectively. CMOS inverter 218 forms a second transconductance amplifier coupled to the first transconductance amplifier formed by CMOS inverter 202. When CMOS inverter 218 is enabled via a control input 220, the overall oscillator circuit gain is substantially increased, or augmented, which implies a wide open loop bandwidth, resulting in rapid oscillator start-up times, as will be described in further detail shortly.

The operation of the dual bandwidth crystal oscillator 200 is controlled by two inputs, a bandwidth control input (BWC) 224 and an oscillator on input (OSON) 204. In operation, when a logic zero level, or low input voltage, is applied to the OSON input 204, the output of CMOS NAND gate 202 is forced to a high output voltage, or to a logic one level. This effectively disables the crystal oscillator formed from CMOS inverter 202. The low voltage applied to the OSON input is also applied to an input of NAND gate 222, forcing the output to a logic one level. The logic one level is applied to the control input 220 of CMOS inverter 218, which also forces the output of CMOS inverter 218 into the 3-state, or high impedance mode, effectively isolating the second transconductance amplifier formed by CMOS inverter 218 from the first transconductance amplifier formed by CMOS inverter 202, and disabling any possible oscillation of the oscillator circuit. Such complete disabling of the oscillator circuit is highly desirable for battery saving operations, as the oscillator circuit current is reduced substantially to zero. Since the supply voltage is not removed to effect the battery saving operation, significantly reduced start-up times are also realized, as compared to switching the supply voltage in a conventional battery saving manner, when a logic one level is applied to the OSON input 204.

When the logic one level signal is applied to the OSON input 204, the operation of CMOS inverter 218 is independently controlled from CMOS inverter 202 by the bandwidth control input (BWC) 224. When a logic zero level signal is applied from the BWC input to the input of NAND gate 222, the output is forced to a logic one level. The logic one signal is then applied to the control input 220 of CMOS inverter 218, which forces the output of CMOS inverter 218 into the 3-state, or high impedance mode, effectively isolating the second transconductance amplifier formed by CMOS inverter 218 from the first transconductance amplifier formed by CMOS inverter 202. As a result, oscillation is effected only by CMOS inverter 202 in conjunction with oscillator crystal 210.

In summary, a dual bandwidth crystal oscillator has been described which provides oscillator on/off control, and a separate control input allows selection of rapid oscillator start-up times, or minimum oscillator operating current. While only a dual bandwidth crystal controlled oscillator has been described, it will be appreciated that a multiple bandwidth crystal controlled oscillator can be obtained by paralleling multiple transconductance amplifiers formed with multiple CMOS inverters having 3-state outputs to provide the isolation described. One or more of the multiple transconductance amplifiers can be selected to provide a plurality of amplifier configurations. This allows flexibility when selecting a particular amplifier configuration which would be required to drive a particular type of crystal or to operate over a broad frequency range. It will be appreciated that different crystal cuts require different drive considerations, and reliable operation at frequencies, such as from 32 KHz to 20 MHz, would require additional drive considerations. The ability to switch amplifier configurations using the BWC input would also allow such operation as manually switching frequencies and also amplifier configurations to provide similar performance.

Figure 3:
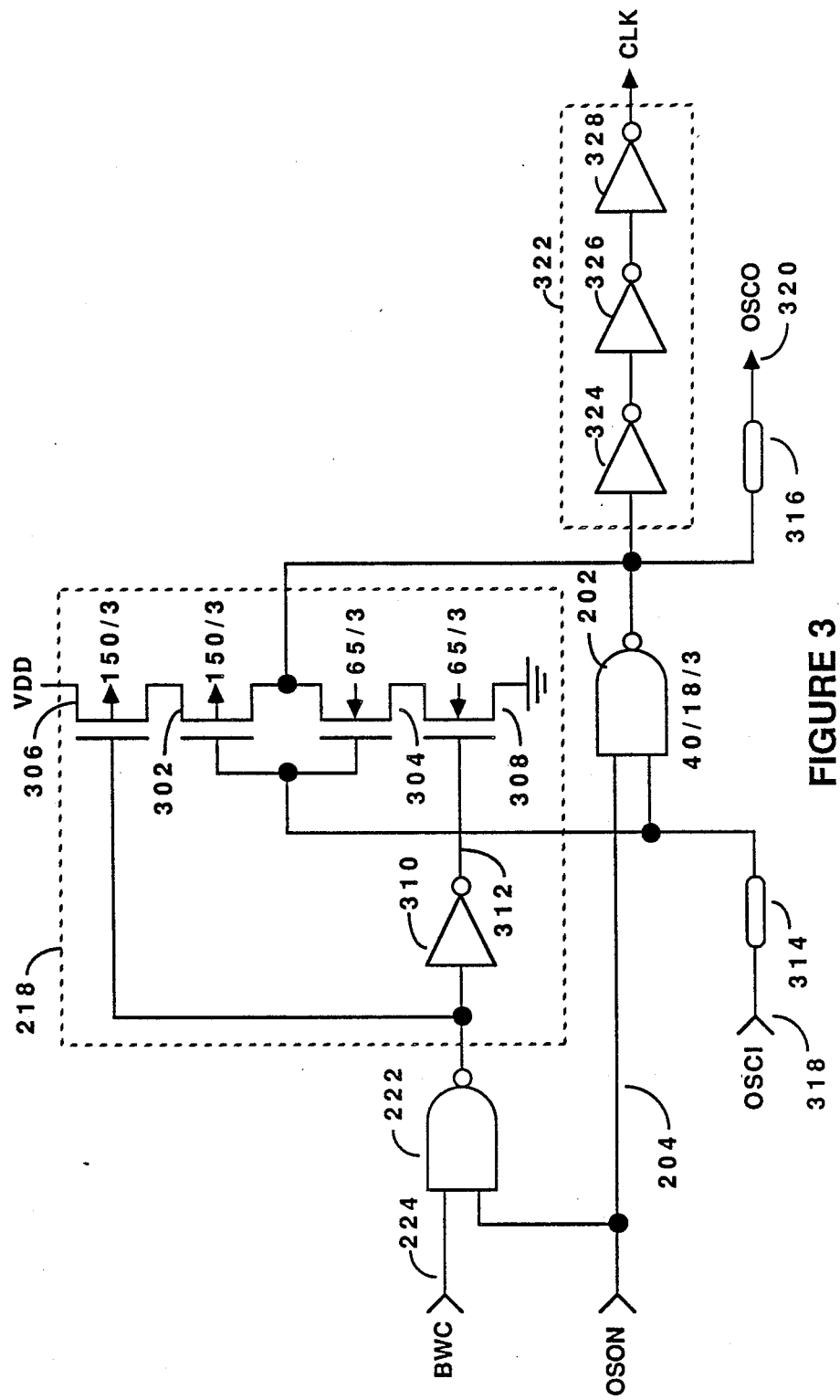
FIG. 3 is an electrical schematic diagram of the dual bandwidth crystal controlled oscillator of the present invention showing a preferred construction.

FIG. 3 is an electrical schematic diagram of a CMOS integrated circuit implementation of the dual bandwidth crystal controlled oscillator 200 of the present invention. Since the operation of the dual bandwidth crystal oscillator was described in FIG. 2, the discussion to follow will be limited only to the new elements shown and their function. CMOS inverter 218 comprises four MOS transistors 302, 304, 306, and 308, and a CMOS inverter 310. MOS transistor 302 is a P channel transistor, and MOS transistor 304 is an N channel transistor which are connected as a conventional CMOS inverter, the input being the gate electrode of MOS transistor 302 coupled to the gate electrode of MOS transistor 304, and the output being the drain electrode of MOS transistor 302 coupled to the drain electrode of MOS transistor 304. The source electrode of MOS transistor 302 couples to the drain electrode of P channel MOS transistor 306, while the source electrode of MOS transistor 304 couples to the drain electrode of N channel MOS transistor 308. The source electrode of MOS transistor 306 couples to a $V_{DD}$, or supply voltage, while the source electrode of MOS transistor 308 is coupled to a common, or ground potential. The gate electrode of MOS transistor 308 couples to the output of inverter 310, while the gate electrode of MOS transistor 306 couples to the input of inverter 310 which further couples to the control signal output 220 of CMOS NAND gate 222.

When a logic zero level signal is applied to either the BWC input 224 or the OSON input 204, the output of CMOS NAND gate 222 is a logic one level. The logic one level signal is applied to the gate electrode of MOS transistor 306 turning the transistor off, and is also applied to the input of inverter 310. The output of inverter 310 is forced to a logic zero level, which is then applied to the gate of MOS transistor 308, also turning MOS transistor 308 off. MOS transistors 306 and 308 when turned off form part of an isolation means by placing CMOS inverter 218 in a 3-state, or high impedance output mode as is well known in the art, effectively isolating the second transconductance amplifier formed by MOS transistors 302 and 304, from the first transconductance amplifier formed by CMOS inverter 202. CMOS inverter 310 forms the remainder of the circuit providing the isolation means.

The gate geometries of the P channel transistors and N channel transistors of CMOS inverter 218, are indicated in FIG. 3 as 150/3 and 65/3 respectively, and indicate the relative gate width to gate length of each of the MOS transistors, as compared to those of CMOS inverter 202 which are 40/3 for the P channel MOS transistor and 18/3 for the N channel MOS transistor. Since both CMOS inverter 202 and CMOS inverter 218 are integrated together on a single integrated circuit chip, when CMOS inverter 218 is enabled, a substantially larger geometry CMOS inverter is effectively formed. Table 1 indicates a number of important oscillator performance parameters derived from the selective control of CMOS inverter 202 and CMOS inverter 218.

TABLE 1

|   | Oscillator Current Drain | Oscillator Start-up time |
|---|---|---|
| Low Bandwidth | 80 micro-amps | 15 milli-sec. |
| High Bandwidth | 145 micro-amps | 3.5 milli-sec. |

As can be seen from Table 1, the current drain was almost doubled which resulted in a five times reduction in the oscillator start-up time of the high bandwidth crystal oscillator as compared to the low bandwidth crystal oscillator. The oscillator current drains and start-up times indicated are typical for a crystal oscillator operating at approximately 4.2 Megahertz operating frequency with a 2.8 volt supply voltage. It will be appreciated that the oscillator current drains actually achieved are a function of the oscillator operating frequency and the CMOS integrated circuit process used to manufacture the integrated circuit which can vary widely from manufacturer to manufacturer.

The oscillator crystal (not shown in FIG. 3) is coupled to the dual bandwidth crystal oscillator via crystal oscillator input (OSCI) 318 and crystal oscillator output (OSCO) 320. Static protection is provided by input current limiting resistors 314 and 316, and static protection diodes (not shown), which are well known to one of ordinary skill in the art.

In the preferred embodiment of the present invention, the output of the dual bandwidth crystal oscillator in operation is substantially a sinusoidal output voltage having a voltage swing substantially between $V_{DD}$ and ground. Buffer amplifier 322, which operates as a waveshaping means, provides a square wave output from the oscillator for coupling to other external electronic circuits. In the preferred embodiment of the present invention, buffer 322 is preferably three CMOS inverters 324, 326 and 328 which perform the waveshaping function, which are designed so as to minimize drive level on the output of the oscillator, in a manner well known to one of ordinary skill in the art.

Figure 4:
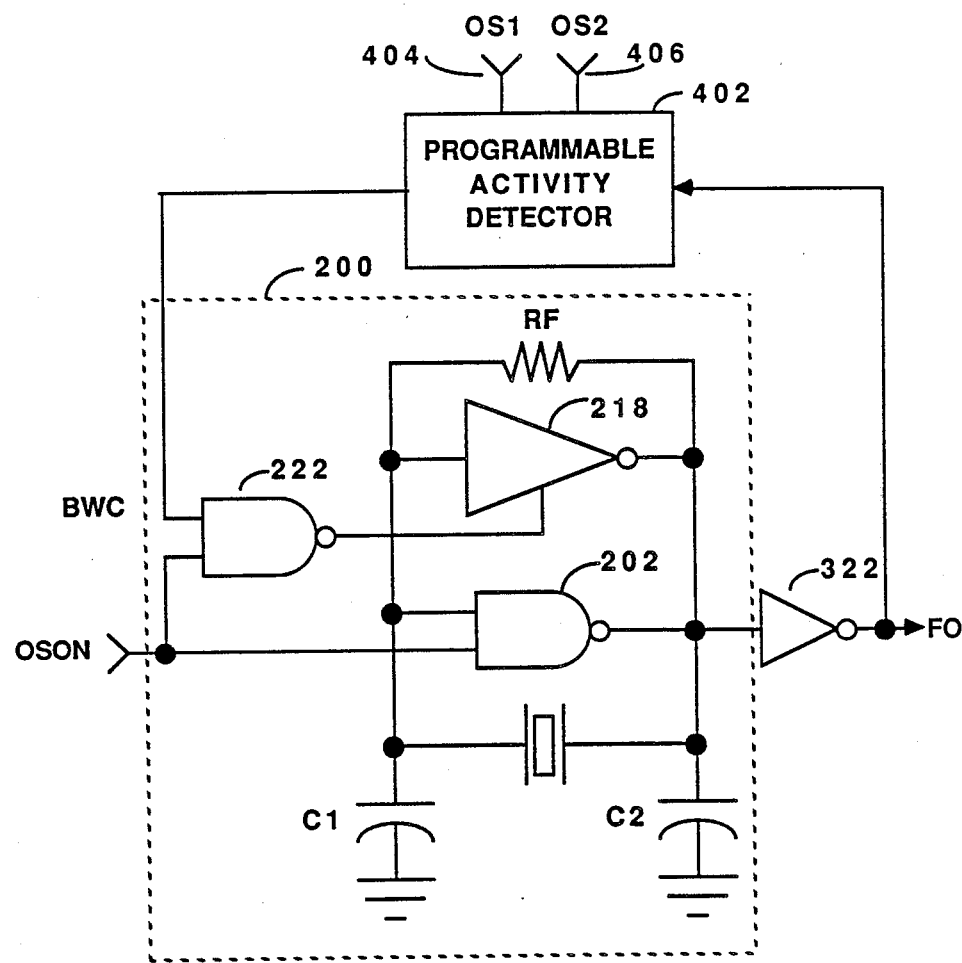
FIG. 4 is an electrical block diagram of a programmable dual bandwidth crystal controlled oscillator of the present invention employing a programmable activity detector.
Figure 6:
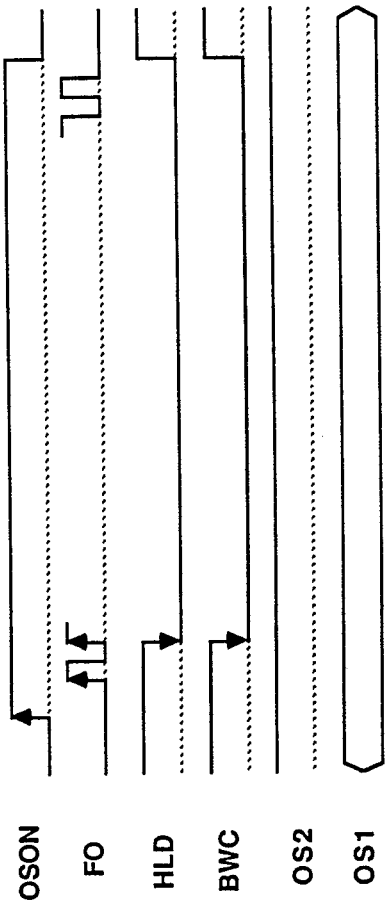
FIG. 6 is a timing diagram of the operation of the programmable dual bandwidth crystal controlled oscillator.

FIG. 4 is an electrical block diagram of one of the preferred embodiments of the present invention as applied to a conventional oscillator, a programmable dual bandwidth crystal controlled oscillator 400. The operation of the programmable dual bandwidth crystal oscillator 400 is best understood in conjunction with FIG. 6 which shows the operational timing diagram. When the OSON signal is a logic zero level, as shown in FIG. 6, both the first transconductance amplifier formed by CMOS inverter 202 and the second transconductance amplifier, formed by CMOS inverter 218, are turned off in FIG. 4, as previously described, disabling the oscillator. Three operating modes are selectable for the programmable dual bandwidth crystal oscillator 400 of FIG. 4. These are shown in Table 2 below.

TABLE 2

| OS2 | OS1 | Bandwidth |
|---|---|---|
| 0 | 0 | Low bandwidth operation only |
| 0 | 1 | High bandwidth operation only |
| 1 | x | Automatic bandwidth operation |

The operation of the first two operating modes will be described in detail with FIG. 5. The present description using FIGS. 4 and 6 will describe the automatic bandwidth operation mode. As shown in FIG. 6, OS2 is held at a constant logic one level throughout the oscillator control operation, and OS1 is shown as having either a logic one level or logic zero level input. When oscillator 400 is disabled, a logic one level is applied to the BWC input, as will be described in detail shortly. When a logic one level is applied to the OSON input, both the BWC and OSON inputs to NAND gate 222 are high, resulting in the selection of the high bandwidth operation described in FIG. 3, with the second transconductance amplifier 218 coupled to the first transconductance amplifier 202. The first and second transconductance amplifiers are enabled, allowing the oscillator to begin oscillation. The oscillator output begins to switch at the operating frequency $F_O$, shortly after a logic one level is applied to the OSON input. The output of buffer 322 is monitored by the programmable activity detector 402 of FIG. 4 the inputs previously selected as OS2 is a logic one level and a don't care level for OS1. When several transitions of the buffer output have occurred, as shown in FIG. 6, indicating the oscillator has started, the output of the programmable activity detector switches to a logic zero level, which is then coupled back to the BWC input. The total time that the dual bandwidth crystal oscillator is in the high bandwidth mode is on the order of three milliseconds for the preferred embodiment of the present invention. The dual bandwidth crystal oscillator is then switched from the high bandwidth to the low bandwidth mode when a logic zero level is applied to the BWC input. Oscillator 400 remains in the low bandwidth mode until the oscillator is again disabled, when a logic zero level is applied to the OSON input, as shown in FIG. 6. While the BWC input is held low, the current drain of the dual bandwidth crystal oscillator is at the lowest level, providing minimum power consumption as compared to the power consumption required to rapidly start-up the oscillator.

In summary, when an activity detector circuit is added to the dual bandwidth crystal oscillator, the oscillator may be repeatedly turned on and off, as in a battery saving operation sequence, while rapid oscillator start-up is assured by the brief application of a high current, followed by maintenance of the oscillator oscillation at a relatively low current drain.

Figure 5:
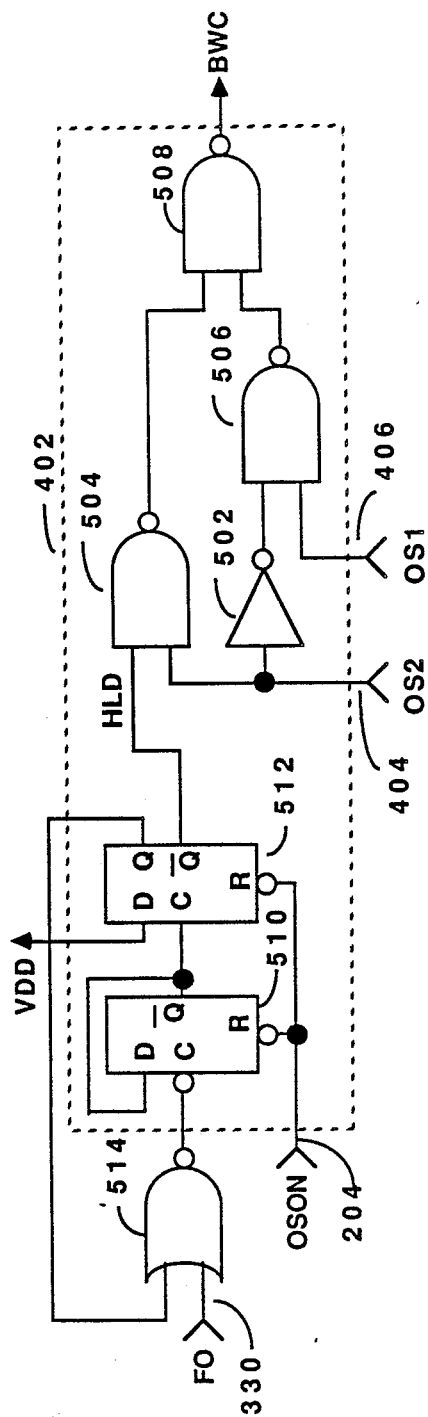
FIG. 5 is an electrical schematic diagram of the programmable activity detector of the present invention.

FIG. 5 is an electrical schematic diagram of the programmable activity detector of the present invention suitable for use with a conventional, or non-synthesized crystal oscillator. FIG. 5 is also best understood with reference to FIG. 6, which shows some, but not all of the timing waveforms during operation of the programmable activity detector. As previously described, the programmable activity detector 402 in FIG. 5 provides three modes of operation, listed in Table 2. Each operating mode will be described in detail separately.

The first operating mode of the programmable activity detector indicated in Table 2 is the low bandwidth only operation. In this instance, the OS2 input 404 is a logic zero level signal, and the OS1 input 406 is also a logic zero level signal. When a logic zero level signal is applied to the OS2 input, the input to CMOS inverter 502 is a logic zero level as is the input to CMOS NAND gate 504. A logic one is forced at the output of CMOS inverter 502, which is applied as an input to CMOS NAND gate 506. The other input to CMOS NAND gate 506 comes from the OS1 input which is a logic zero level input. Consequently, the output of CMOS NAND gate 506 is a logic one level which is applied as an input to CMOS NAND gate 508. Since the input to CMOS NAND gate 504 which comes from the OS2 input is a logic zero level at this time, the output of CMOS NAND gate 504 is forced to a logic one level, independent of any signal condition being applied at the other gate input. With both inputs to CMOS NAND gate 508 being at logic one levels, the output of CMOS NAND gate 508 is forced to a logic zero level. From the previous description, when a logic zero level is applied at the BWC input of the dual bandwidth crystal controlled oscillator 200, the second transconductance amplifier is disabled, leaving only the first transconductance amplifier in the circuit with the oscillator crystal. From the previous description, this was described as the low bandwidth mode, wherein the oscillator is operating at the minimum current level to maintain reliable crystal oscillation.

The second operating mode of the programmable activity detector indicated in Table 2 is the high bandwidth only operation. In this instance, the OS2 input 404 remains a logic zero level signal, while the OS1 input 406 is a logic one level signal. When a logic zero level signal is applied to the OS2 input, the input to CMOS inverter 502 is a logic zero level as is the input to CMOS NAND gate 504. A logic one is forced at the output of CMOS inverter 502, which is applied as an input to CMOS NAND gate 506. The other input to CMOS NAND gate 506 comes from the OS1 input which is also a logic one level input. Consequently, the output of CMOS NAND gate 506 is a logic zero level which is applied as an input to CMOS NAND gate 508. Since the input to CMOS NAND gate 504 which comes from the OS2 input is a logic zero level at this time, the output of CMOS NAND gate 504 is forced to a logic one level, independent of any signal condition being applied at the other gate input. With one input to CMOS NAND gate 508 being at logic one level and one input being a logic zero level, the output of CMOS NAND gate 508 is forced to a logic one level. From the previous description, when a logic one level is applied at the BWC input of the dual bandwidth crystal controlled oscillator 200, the second transconductance amplifier is enabled, augmenting the gain of the first transconductance amplifier in the circuit with the oscillator crystal. From the previous description this was described as the high bandwidth mode, wherein the oscillator is operating at the maximum current level to insure rapid oscillator start-up times.

The third operating mode of the programmable activity detector indicated in Table 2 is the automatic bandwidth mode of operation. In this instance, the OS2 input 404 is a logic one level signal, while the OS1 input 406 can be either a logic one level signal or a logic zero level signal. When a logic one level signal is applied to the OS2 input, the input to CMOS inverter 502 is a logic one level as is the input to CMOS NAND gate 504. A logic zero is forced at the output of CMOS inverter 502, which is applied as an input to CMOS NAND gate 506. The other input to CMOS NAND gate 506 comes from the OS1 input. Since the output of CMOS inverter 502 is a logic zero level signal, the output of CMOS NAND gate 506 is a logic one level, independent of the OS1 input signal, which is applied as an input to CMOS NAND gate 508. Since the input to CMOS NAND gate 504 which comes from the OS2 input is a logic one level at this time, the signal at the second input to CMOS NAND gate 504 determines the output condition.

From the previous description, when the OSON input to the dual bandwidth oscillator is low, as shown in FIG. 6, the oscillator is disabled. The logic zero level signal is also applied the reset inputs of D flip-flops 510 and 512, resetting the flip-flops to a logic zero level at the Q output of D flip-flops 510 and 512. This condition will continue as long as the reset input level is a logic zero level, which occurs when the device is in the battery saving mode. The Q-bar output of D flip-flop 512 is then a logic one level which is applied to the input of CMOS NAND gate 504. Since the other input is also a logic one level from the description above, the output of CMOS NAND gate 504 is forced to a logic zero level which is applied as an input to CMOS NAND gate 508. With one input to CMOS NAND gate 508 being at logic zero level, the output of CMOS NAND gate 508 is forced to a logic one level. From the previous description, when a logic one level is applied at the BWC input of the dual bandwidth crystal controlled oscillator 200, the second transconductance amplifier is enabled, augmenting the gain of the first transconductance amplifier in the circuit with the oscillator crystal. From the previous description this was described as the high bandwidth mode, wherein the oscillator would be operating at the maximum current level to insure rapid oscillator start-up times. As a result, the conditions described have placed the dual bandwidth crystal oscillator in the high bandwidth mode while the battery saving mode is active.

When the battery saving mode is deactivated, a logic one level is applied to the OSON input, allowing the dual bandwidth crystal oscillator to begin operation in the high bandwidth mode. The clock output 330 is applied to one input of CMOS NOR gate 514, with the other input being applied from the Q output of D flip-flop 512, which is a logic zero level at this time, as previously described. On the first positive transition of the clock output 330, the output of CMOS NOR gate 514 is forced to a logic zero level, clocking D flip-flop 510. Since the D input is a logic one level which is applied from the Q-bar output of D flip-flop 510, the Q output of D flip-flop 510 is forced to a logic one level. On the next positive transition of the clock output 330, the output of CMOS NOR gate 514 is again forced to a logic zero level, again clocking D flip-flop 510. Since the D input is a logic zero level which is applied from the Q-bar output of D flip-flop 510, the Q output of D flip-flop 510 is forced to a logic zero level, which in turn clocks D flip-flop 512. Since the D input of D flip-flop is a logic one level, the Q output is forced to a logic one level, which is in turn applied back as an input to CMOS NOR gate 514, disabling any further clocking of D flip-flops 510 and 512. The Q-bar output of D flip-flop is now at a logic zero level, which is applied to the input of CMOS NAND gate 504, forcing the output to a logic one level which in turn is applied as one input to CMOS NAND gate 508. The other input to CMOS NAND gate 508 is also at a logic one level, as previously described, forcing a logic zero level output which is applied to the BWC input of the dual bandwidth crystal oscillator. From the previous description, this results in the dual bandwidth crystal oscillator to be placed in the low bandwidth mode, wherein the second transconductance amplifier is disabled, resulting in operation of the oscillator at the lower current drain mode. This mode is maintained until the next battery saver duty cycle occurs, which resets the programmable activity detector, as previously described. It will be appreciated from the previous description, the actual number of transitions of the oscillator on start-up is by way of example only two, and that any number of transitions may be monitored to determine oscillator activity. It will also be appreciated, the greater number of transitions that are monitored, the greater the energy consumed during the start-up cycle of oscillator operation.

In summary, an activity detector has been described which allows automatic selection of the high and low bandwidth modes of operation of the dual bandwidth crystal oscillator. When the activity detector is utilized as described, rapid oscillator start-up is provided followed by maintaining the oscillator oscillation at a lower current drain.

Figure 7:
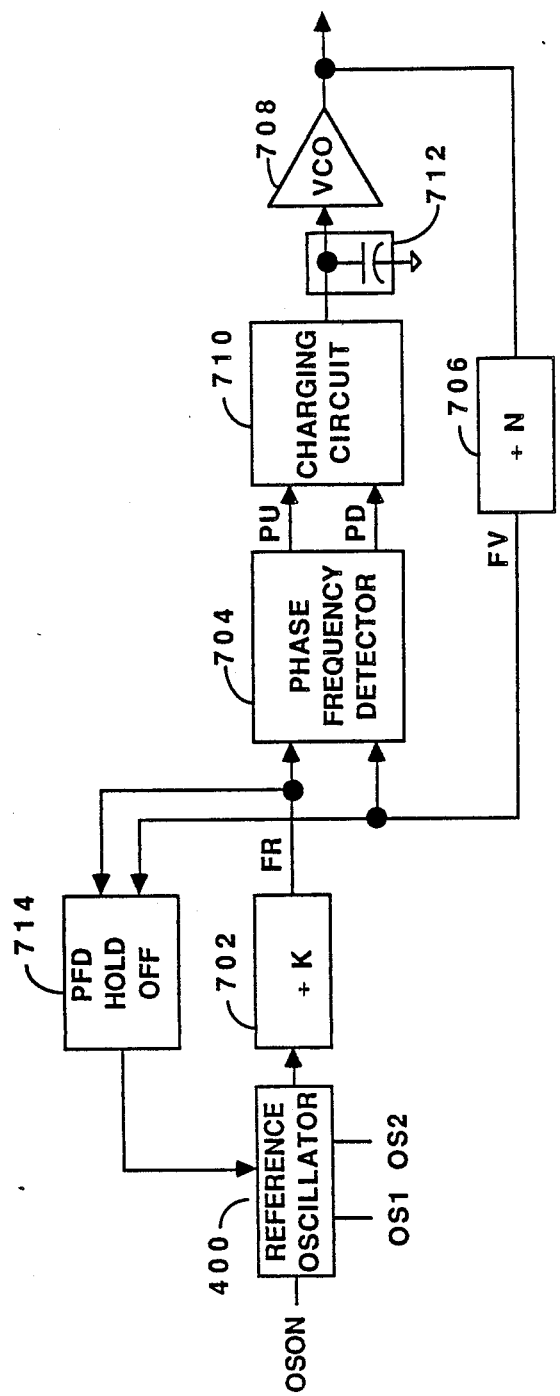
FIG. 7 is an electrical block diagram of a frequency synthesizer utilizing the dual bandwidth crystal oscillator of the present invention.

FIG. 7 is an electrical block diagram of a frequency synthesizer 700 utilizing the dual bandwidth crystal oscillator 400 of the present invention. Only a brief description of the operation of the frequency synthesizer will be provided, as it will be appreciated by one of ordinary skill in the art, that the application of the dual bandwidth crystal controlled oscillator 400 is a straight foreword extension of operation from the non-frequency synthesized oscillator. The output of the dual bandwidth crystal controlled oscillator, or reference oscillator 400, is applied to ÷K divider 702 which appropriately divides the input frequency to derive a reference frequency FR which is applied as one input to phase frequency detector 704. The other input to the phase frequency detector 704 is derived from ÷N divider 706. The two input frequencies are compared by the phase frequency detector 704, and depending upon which frequency leads the other, a pump up (PU) or pump down (PD) signal is generated at the output which is applied to the charging circuit 710. The charging circuit will either increase, or decrease the voltage across capacitor 712, thereby increasing or decreasing the output frequency of voltage controlled oscillator 708, which in turn is applied as an input to ÷N divider 706. A more detailed operational description of the operation of the frequency loop is provided in U.S. Pat. No. 4,167,711 to Smoot, entitled "Phase Detector Output Stage for Phase Locked Loop" which is assigned to the assignee of the present invention.

During battery saving operation, the reference oscillator 400 and associated loop components are shut down. Unlike that of a non-synthesized oscillator, which required sensing the dual bandwidth crystal oscillator output to determine oscillator activity, as previously described, the oscillator bandwidth is not switched until both the oscillator 400 and the VCO 708 outputs are active. This is accomplished by the PFD (phase frequency detector) hold off circuit 714 which monitors the outputs of the ÷K divider 702 and the ÷N divider 706 for oscillator activity. A complete description of the operation of the PFD hold off circuit is provided in U.S. patent application Ser. No. 07/322,393, to Herold et al., entitled "Frequency Synthesizer with Control of Start-up Battery Saving Operations". The operation of the dual bandwidth crystal oscillator when utilized with a frequency synthesizer is essentially the same as previously described.

While specific embodiments of this invention have been shown and described, further modifications and improvements will occur to those skilled in the art. All modifications which retain the basic underlying principles disclosed and claimed herein are within the scope and spirit of the present invention.

We claim:

1. A dual bandwidth crystal oscillator, comprising:
   an oscillator crystal;
   a first transconductance amplifier, having an input and an output coupled to said oscillator crystal, and having a first gain sufficient to maintain oscillation with said oscillator crystal at a first current level; and
   a second transconductance amplifier, having an input coupled to said input of said first transconductance amplifier, and an output coupled to said output of said first transconductance amplifier, and having a second gain for augmenting the gain of said first transconductance amplifier to maintain oscillation with said oscillator crystal at a second current drain,
   said second transconductance amplifier further having isolation means, responsive to a first bandwidth control signal for isolating said second transconductance amplifier from said first transconductance amplifier, thereby effecting oscillation at the first current drain, and further responsive to a second bandwidth control signal for effecting the coupling of said second transconductance amplifier to said first transconductance amplifier, thereby effecting oscillation at the second current drain.

2. The dual bandwidth crystal oscillator according to claim 1, wherein said first transconductance amplifier further includes battery saving means responsive to a battery saving control signal, for disabling the oscillation of said oscillator crystal with said first transconductance amplifier.

3. The dual bandwidth crystal oscillator according to claim 2, wherein said isolation means is further responsive to the battery saving control signal, for isolating said second transconductance amplifier from said first transconductance amplifier, thereby disabling the oscillation of said oscillator crystal by said second transconductance amplifier.

4. The dual bandwidth crystal oscillator according to claim 1, wherein said second current drain is substantially greater than said first current drain.

5. The dual bandwidth crystal oscillator according to claim 1, wherein said first transconductance amplifier is a CMOS gate.

6. The dual bandwidth crystal oscillator according to claim 5, wherein said CMOS gate is a NAND gate.

7. The dual bandwidth crystal oscillator according to claim 1, wherein said second transconductance amplifier is a CMOS inverter.

8. The dual bandwidth crystal oscillator according to claim 7, wherein said CMOS inverter has a 3-state output.

9. The dual bandwidth crystal oscillator according to claim 1, wherein the output of said oscillator is substantially sinusoidal.

10. The dual bandwidth crystal oscillator according to claim 9, further comprising waveshaping means for generating a square wave output signal to an external circuit.

11. The dual bandwidth crystal oscillator according to claim 3, further comprising activity detector means, responsive to the battery saving control signal, for generating the second bandwidth control signal during the absence of oscillator activity, said activity detector means, further generating the first bandwidth control signal, following the detection of oscillator activity, whereby rapid oscillator start-up is effected with the second bandwidth control signal, and low current operation is effected with the first bandwidth control signal.

* * * * *